(12) United States Patent
Kim et al.

(10) Patent No.: US 11,721,278 B2
(45) Date of Patent: Aug. 8, 2023

(54) LIGHT EMITTING DISPLAY APPARATUS FOR SENSING CHARACTERISTIC CHANGE OF STAGE AND SUPPLYING COMPENSATION SIGNAL TO COMPENSATE FOR SAME

(71) Applicant: LG DISPLAY CO., LTD., Seoul (KR)

(72) Inventors: Subin Kim, Paju-si (KR); MyungHo Ban, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/559,799

(22) Filed: Dec. 22, 2021

(65) Prior Publication Data

US 2022/0208081 A1 Jun. 30, 2022

(30) Foreign Application Priority Data

Dec. 31, 2020 (KR) .......................... 10-2020-0189828

(51) Int. Cl.
*G09G 3/32* (2016.01)

(52) U.S. Cl.
CPC ....... *G09G 3/32* (2013.01); *G09G 2300/0413* (2013.01); *G09G 2310/0286* (2013.01); *G09G 2310/061* (2013.01); *G09G 2330/12* (2013.01)

(58) Field of Classification Search
CPC ............... G09G 3/2092; G09G 3/2096; G09G 3/32–3291; G09G 2300/0413; G09G 2300/0421; G09G 2300/043; G09G 2300/0871; G09G 2310/02; G09G 2310/0202; G09G 2310/0243; G09G 2310/0264; G09G 2310/0267; G09G 2310/0286–0291; G09G 2310/06–063; G09G 2310/067; G09G 2320/0204; G09G 2320/0223; G09G 2320/0252; G09G 2320/04; G09G 2320/043; G09G 2320/045; G09G 2320/06; G09G 2320/0693; G09G 2320/08; G09G 2330/028; G09G 2330/12

See application file for complete search history.

(56) References Cited

U.S. PATENT DOCUMENTS

| | | | |
|---|---|---|---|
| 10,276,121 B2 | 4/2019 | Kim et al. | |
| 2014/0300399 A1* | 10/2014 | Miyake | G09G 3/3648 327/296 |

(Continued)

FOREIGN PATENT DOCUMENTS

| | | |
|---|---|---|
| KR | 2017-0079997 A | 7/2017 |
| KR | 2018-0072269 A | 6/2018 |
| KR | 2020-0030423 A | 3/2020 |

*Primary Examiner* — Nathan Danielsen
(74) *Attorney, Agent, or Firm* — Polsinelli PC (57) ABSTRACT

A light emitting display apparatus comprises a gate driver including stages connected with gate lines provided in a display area and a dummy stage connected with dummy gate lines provided in a non-display area, a sensing unit connected with the dummy stage connected with at least two dummy gate lines provided in the non-display area, and a controller connected with the sensing unit, wherein the dummy stage sequentially outputs at least two gate pulses, the sensing unit senses a voltage of a Q node to which a Q node signal for allowing the gate pulses to be output from the dummy stage is supplied, and the controller supplies a compensation signal based on the voltage to the stages.

14 Claims, 7 Drawing Sheets

(56) References Cited

U.S. PATENT DOCUMENTS

| | | | |
|---|---|---|---|
| 2014/0376682 A1* | 12/2014 | Jang | G11C 19/28 377/64 |
| 2018/0033363 A1* | 2/2018 | Lim | G09G 3/20 |
| 2020/0333391 A1* | 10/2020 | Park | G09G 3/3266 |
| 2021/0035517 A1* | 2/2021 | Liu | G09G 3/3677 |
| 2021/0201816 A1* | 7/2021 | Kim | G09G 3/3266 |

* cited by examiner

LIGHT EMITTING DISPLAY APPARATUS FOR SENSING CHARACTERISTIC CHANGE OF STAGE AND SUPPLYING COMPENSATION SIGNAL TO COMPENSATE FOR SAME

CROSS-REFERENCE TO RELATED APPLICATION

This application claims the priority of Korean Patent Application No. 10-2020-0189828 filed on Dec. 31, 2020, which is hereby incorporated by reference in its entirety.

BACKGROUND

Field of the Disclosure

The present disclosure relates to a light emitting display apparatus.

Description of the Background

A light emitting display apparatus is a display apparatus for outputting light by using a light emitting element.

A gate driver constituting the light emitting display apparatus sequentially outputs gate pulses to gate lines. To this end, the gate driver is comprised of transistors.

When the light emitting display apparatus is used for a long time, characteristics of transistors constituting the gate driver may be changed, whereby an abnormal gate pulse may be output to the gate line.

SUMMARY

The present disclosure has been made in view of the above problems and is to provide a light emitting display apparatus that may sense a characteristic change of a stage constituting a gate driver and supply a compensation signal, which may compensate for the characteristic change, to the stage.

In addition, additional features of the present disclosure will be clearly understood by those skilled in the art from the following description of the present disclosure.

In accordance with an aspect of the present disclosure, the above and other features can be accomplished by the provision of a light emitting display apparatus comprising a gate driver including stages connected with gate lines provided in a display area and a dummy stage connected with dummy gate lines provided in a non-display area, a sensing unit connected with the dummy stage connected with at least two dummy gate lines provided in the non-display area, and a controller connected with the sensing unit, wherein the dummy stage sequentially outputs at least two gate pulses, the sensing unit senses a voltage of a Q node to which a Q node signal for allowing the gate pulses to be output from the dummy stage is supplied, and the controller supplies a compensation signal based on the voltage to the stages.

BRIEF DESCRIPTION OF THE DRAWINGS

The above and other features and advantages of the present disclosure will be more clearly understood from the following detailed description taken in conjunction with the accompanying drawings, in which.

DETAILED DESCRIPTION

Advantages and features of the present disclosure and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete and will fully convey the scope of the present disclosure to those skilled in the art. Further, the present disclosure is only defined by scopes of claims.

In the drawings, the same or similar elements are denoted by the same reference numerals even though they are depicted in different drawings. Wherever possible, the same reference numbers will be used throughout the drawings to refer to the same or like parts.

A shape, a size, a ratio, an angle and a number disclosed in the drawings for describing aspects of the present disclosure are merely an example and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise', 'have' and 'include' described in the present disclosure are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~' and 'next to~', one or more portions may be arranged between two other portions unless 'just' or 'direct' is used.

In describing a temporal relationship, for example, when the temporal order is described as 'after~', 'subsequent~', 'next~' and 'before~', a case which is not continuous may be included unless 'just' or 'direct' is used.

It should be understood that the term "at least one" includes all combinations related with any one item. For example, "at least one among a first element, a second element and a third element" may include all combinations of two or more elements selected from the first, second and third elements as well as each element of the first, second and third elements.

It will be understood that, although the terms "first," "second," etc. may be used herein to describe various elements, these elements should not be limited by these terms. These terms are only used to distinguish one element from another. For example, a first element could be termed a second element and, similarly, a second element could be termed a first element, without departing from the scope of the present disclosure.

Features of various aspects of the present disclosure may be partially or overall coupled to or combined with each other and may be variously inter-operated with each other and driven technically as those skilled in the art can sufficiently understand. The aspects of the present disclosure may be carried out independently from each other or may be carried out together in co-dependent relationship.

Hereinafter, the aspect of the present disclosure will be described in detail with reference to the accompanying drawings.

Figure 1:
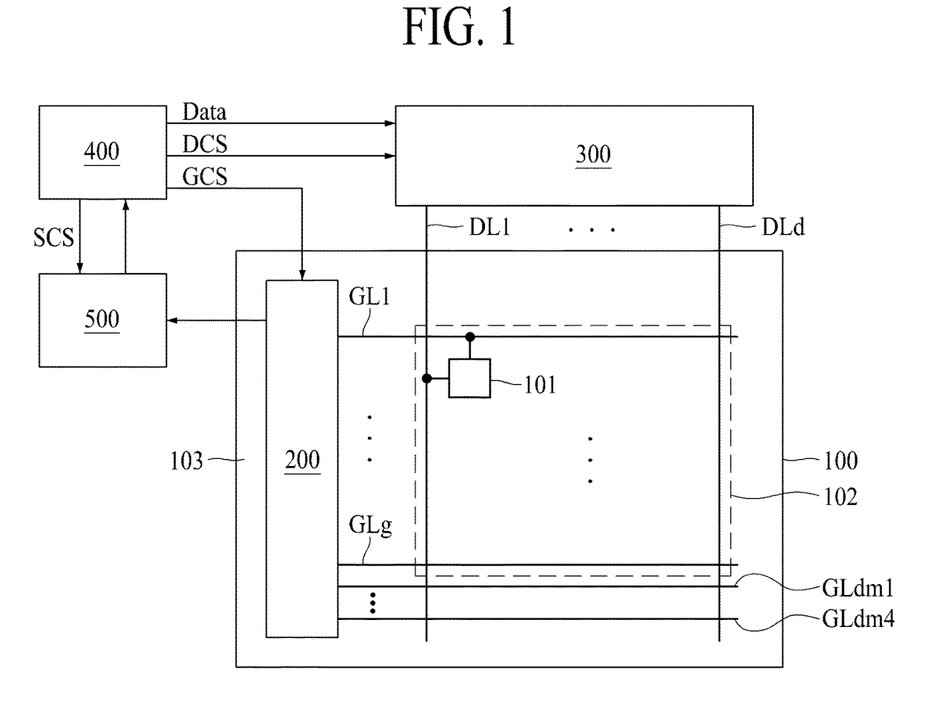
FIG. 1 is an exemplary view illustrating a structure of a light emitting display apparatus according to the present disclosure.
Figure 2:
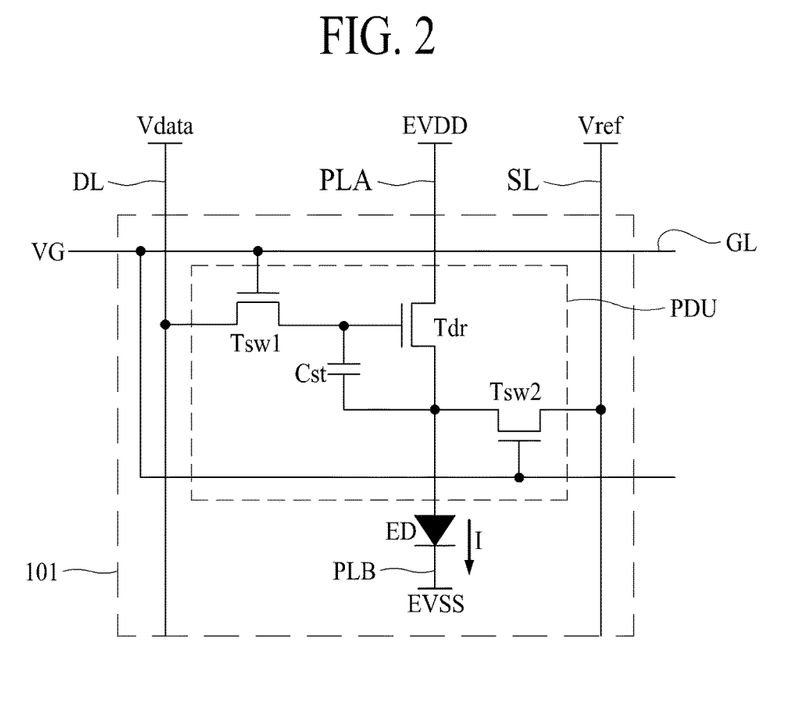
FIG. 2 is an exemplary view illustrating a structure of a pixel applied to a light emitting display apparatus according to the present disclosure.
Figure 3:
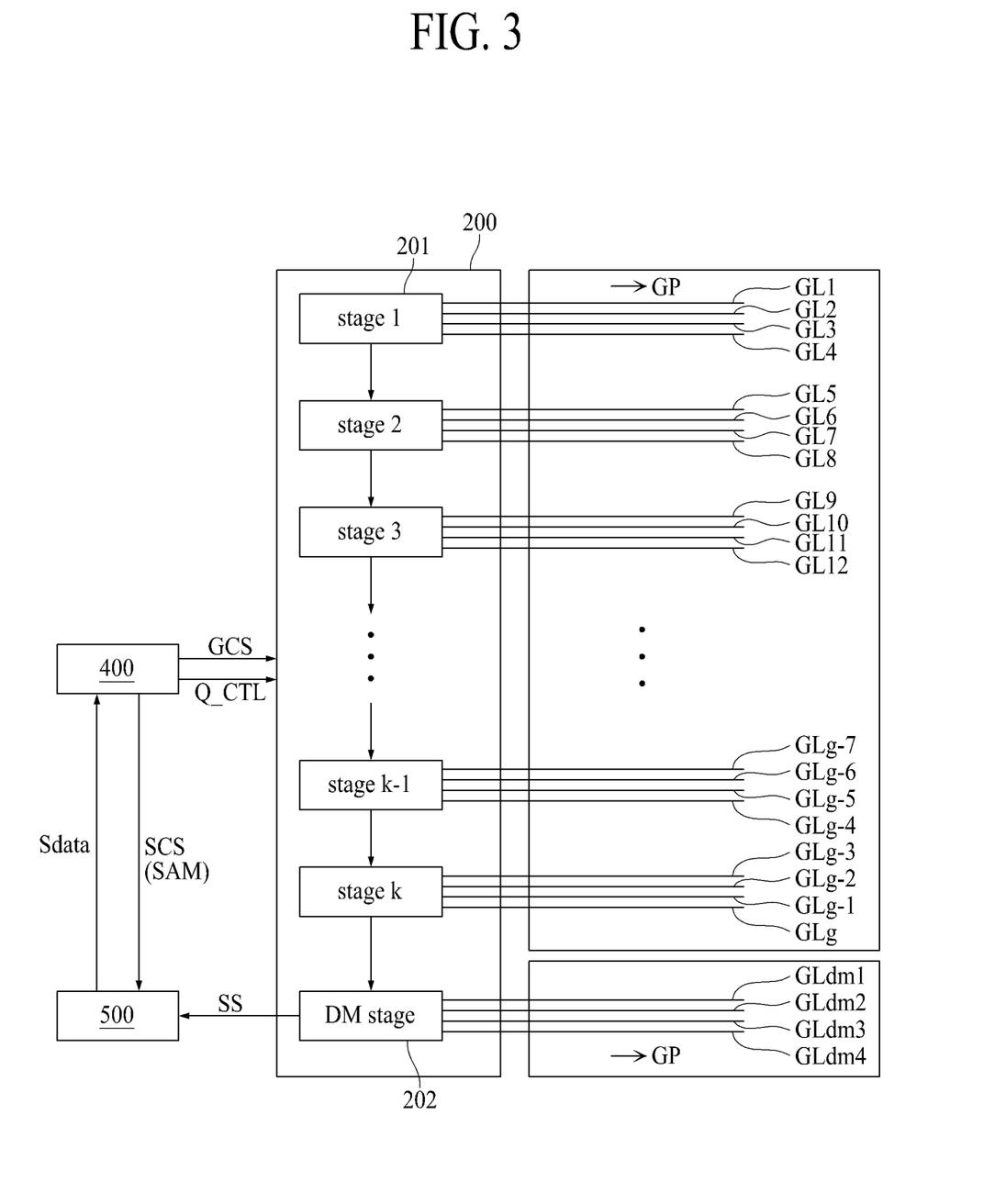
FIG. 3 is an exemplary view illustrating a configuration of a gate driver applied to a light emitting display apparatus according to the present disclosure.
Figure 4:
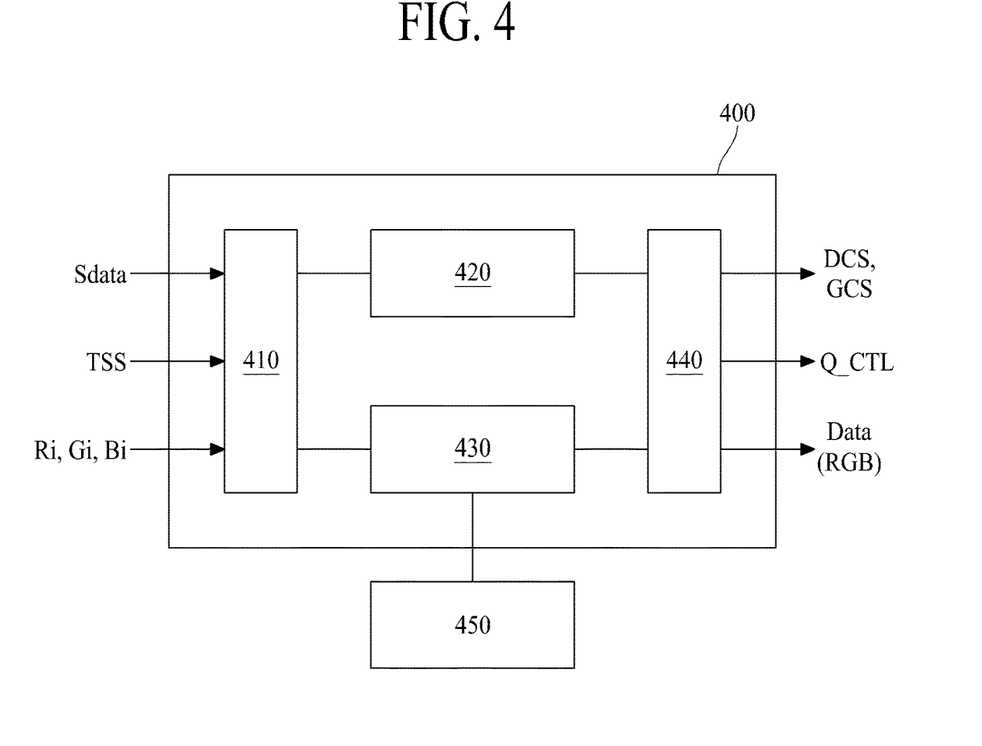
FIG. 4 is an exemplary view illustrating a configuration of a controller applied to a light emitting display panel according to the present disclosure.

FIG. 1 is an exemplary view illustrating a structure of a light emitting display apparatus according to the present disclosure, FIG. 2 is an exemplary view illustrating a structure of a pixel applied to a light emitting display apparatus according to the present disclosure, FIG. 3 is an exemplary view illustrating a configuration of a gate driver applied to a light emitting display apparatus according to the present disclosure, and FIG. 4 is an exemplary view illustrating a configuration of a controller applied to a light emitting display panel according to the present disclosure.

The light emitting display apparatus according to the present disclosure may constitute various electronic devices. The electronic device may be, for example, a smart phone, a tablet PC, a television, a monitor or the like.

As shown in FIGS. 1 to 4, the light emitting display apparatus according to the present disclosure includes a light emitting display panel 100 provided with pixels 101 connected with a gate line GL and a data line DL, a gate driver 200 including stages 201 (stage 1 to stage k) connected with gate lines GL1 to GLg provided in a display area 102 of the light emitting display panel 100 and a dummy stage 202 (DM stage) connected with dummy gate lines GLdm provided in a non-display area 103, a sensing unit 500 connected with the dummy stage 202 connected with at least two dummy gate lines provided in the non-display area 103, a data driver 300 for supplying a data voltage Vdata to the data line DL, and a controller 400 for controlling the gate driver 200, the data driver 300 and the sensing unit 500.

First of all, the light emitting display panel 100 includes the display area 102 and the non-display area 103.

The display area 102 is provided with gate lines GL1 to GLg, data lines DL1 to DLd, sensing lines SL1 to SLd and pixels 101. In this case, 'g' and are natural numbers, and 'k' is a natural number smaller than 'g'.

The dummy gate lines GLdm are provided in the non-display area 103.

As shown in FIG. 2, the pixel 101 provided in the light emitting display panel 100 may include a light emitting element ED, a switching transistor Tsw1, a storage capacitor Cst, a driving transistor Tdr and a sensing transistor Tsw2. That is, the pixel 101 may include a pixel driving unit PDU and a light emitting unit, wherein the pixel driving unit PDU may include a switching transistor Tsw1, a capacitor Cst, a driving transistor Tdr and a sensing transistor Tsw2, and the light emitting unit may include a light emitting element ED.

Brightness of light output from the light emitting element may be controlled in accordance with a magnitude of a current I flowing in the light emitting element ED, a magnitude of the current I flowing in the light emitting element ED may be controlled by the driving transistor Tdr, and the driving transistor Tdr may be controlled by the data voltage Vdata.

The light emitting element ED may include any one of an organic light emitting layer, an inorganic light emitting layer and a quantum dot light emitting layer, or may include a deposited or mixed structure of an organic light emitting layer (or inorganic light emitting layer) and a quantum dot light emitting layer.

Also, the light emitting element ED may emit light corresponding to any one of various colors such as red, green and blue colors, or may emit white light.

The switching transistor Tsw1 constituting the pixel driving unit PDU is turned on or off by a gate signal VG supplied to the gate line GL, and the data voltage Vdata supplied through the data line DL is supplied to the driving transistor Tdr when the switching transistor Tsw1 is turned on.

A first voltage EVDD is supplied to the driving transistor Tdr and the light emitting element ED through a voltage supply line PLA, and a second voltage EVSS is supplied to the light emitting element ED through a voltage line PLB. The voltage supply line PLA and the voltage line PLB may be connected with a power supply unit through the data driver 300 or the gate driver 200, or may directly be connected with the power supply unit.

The sensing transistor Tsw2 is turned on or off by a sensing control signal supplied through a sensing control line, and a sensing line SL may be connected to the sensing transistor Tsw2. In this case, although the sensing control line may be provided in the light emitting display panel as an independent line, as shown in FIG. 2, the gate line GL connected with the switching transistor Tsw1 may be used as the sensing control line. That is, the sensing transistor Tsw2 may be turned on or off by the gate signal VG supplied to the gate line GL.

A reference voltage Vref may be supplied to the pixel 101 through the sensing line SL, and a sensing signal related to a characteristic change of the driving transistor Tdr may be transmitted to the sensing line SL through the sensing transistor Tsw2.

The pixel 101 applied to the present disclosure may be formed in the structure shown in FIG. 2, but the present disclosure is not limited thereto. Therefore, the pixel applied to the present disclosure may be changed in various forms in addition to the structure shown in FIG. 2.

The data driver 300 may be provided on a chip-on film attached to the light emitting display panel 100, and may also be connected to a main substrate provided with the controller 400. In this case, lines for electrically connecting the controller 400, the data driver 300 and the light emitting display panel 100 are provided in the chip-on-film. To this end, the lines are electrically connected with pads provided in the main substrate and the light emitting display panel 100. The main substrate is electrically connected with an external substrate on which the external system is mounted.

The data driver 300 may directly be mounted on the light emitting display panel 100 and then electrically connected with the main substrate.

However, the data driver 300 may be formed as one integrated circuit together with the controller 400, wherein the integrated circuit may be provided in the chip-on film or directly mounted on the light emitting display panel 100.

The data driver 300 may receive the sensing signal related to the characteristic change of the driving transistor Tdr provided in the light emitting display panel from the light emitting display panel and transmit the sensing signal to the controller 400.

Then, the gate driver 200 may be provided as an integrated circuit and then mounted on the non-display area 103, or may directly be embedded in the non-display area 103 using a gate-in-panel (GIP) scheme. When the gate-in-panel scheme is used, the transistors constituting the gate driver 200 may be provided in the non-display area 103 through the same process as that of the transistors provided in the respective pixels 101 of the display area 102.

When the gate pulse generated by the gate driver 200 is supplied to a gate of the switching transistor Tsw1 provided in the pixel 101, the switching transistor Tsw1 is turned on. When a gate-off signal is supplied to the switching transistor Tsw1, the switching transistor Tsw1 is turned off. The gate signal VG supplied to the gate line GL includes a gate pulse and a gate-off signal.

As shown in FIG. 3, the gate driver 200 includes stages 201 (stage 1 to stage k) connected with the gate lines GL1 to GLg provided in the display area 102, and a dummy stage 202 connected with the dummy gate lines GLdm provided in the non-display area 103.

Each of the stages 201 sequentially supplies at least two gate pulses GP to at least two gate lines, and the dummy stage 202 sequentially supplies at least two gate pulses GP to at least two dummy gate lines GLdm.

That is, the number of gate lines GL connected to the stage 201 and the number of dummy gate lines GLdm connected to the dummy stage 202 are the same as each other.

At a display period at which an image is output, the dummy stage 202 may be driven by a start signal transmitted from a previous stage, for example, a (k)th stage, stage k, to output at least two gate pulses to at least two dummy gate lines GLdm. In this case, the start signal may be a carry signal output from the previous stage. The carry signal may be transmitted from a pre-previous stage not the previous stage.

However, a period at which at least two gate pulses are output from the dummy stage 202 may be a blank period at which an image is not output.

That is, the dummy stage 202 is driven together with the stages 201 every frame period. In this case, the frame period refers to a period at which one image is output through the light emitting display panel 100. The frame period includes a display period at which an image is output and a blank period existing between two display periods. At the blank period, a sensing operation, which will be described below, that is, an operation of sensing a characteristic change of the dummy stage 202 may be performed. In this case, the characteristic change of the dummy stage 202 means a voltage change of the dummy stage 202, and especially means a voltage change of a Q node of the dummy stage 202.

As described above, dummy stage 202 may be driven in the same manner as the stage 201. Therefore, the dummy stage 202 may include all of the elements included in the stage 201.

In addition, although the dummy stage 202 is different from the stage 201 in that it is connected to the dummy gate line GLdm provided in the non-display area 203, the dummy stage 202 may include all of the elements included in the stage 201, and may perform all of the functions of the stage 201.

Therefore, a characteristic change, which is the same as the characteristic change of the stages 201, may also be generated in the dummy stage 202.

Therefore, in the present disclosure, the characteristic change of the stages 201 may be predicted using the dummy stage 202, and a compensation signal based on the predicted characteristic change may be supplied to the stages, whereby performance of the stages 201 may stably be maintained.

As described above, each of the stages 201 and the dummy stage 202 may output at least two gate pulses GP. For convenience of description, as shown in FIG. 3, the light emitting display apparatus, which includes the stages 201 and the dummy stage 202, which sequentially output four gate pulses, will be described as an example of the present disclosure.

In this case, 'k' that means the number of stages in FIG. 3 may be g/4, and the number of dummy gate lines GLdm is four.

The sensing unit 500 may sense a characteristic change of the dummy stage 202 in accordance with a sampling signal SAM transmitted from the controller 400, and the sensing signal SS transmitted from the dummy stage 202 to the sensing unit 500 by the characteristic change sensing is converted into the sensing data Sdata in the sensing unit 500, and the sensing data Sdata is transmitted to the controller 400.

The controller 400 generates a compensation signal Q_CTL by using the sensing data Sdata, and the compensation signal Q_CTL may be transmitted to the stages 201 and the dummy stage 202 of the gate driver 200.

A detailed structure and function of the gate driver will be described in detail with reference to FIGS. 5 to 8.

Next, as described above, the sensing unit 500 converts the sensing signal SS transmitted from the gate driver 200 into the sensing data Sdata in accordance with the sampling signal SAM, which is a sensing unit control signal SCS transmitted from the controller 400, and transmits the sensing data Sdata to the controller 400.

That is, the sensing unit 500 senses a characteristic change of the Q node to which a Q node signal for outputting gate pulses from the dummy stage 202 is supplied, and the controller 400 supplies the compensation signal based on the characteristic change sensed by the sensing unit 500 to the stages and the dummy stage. As described above, the characteristic change of the Q node refers to the voltage change of the Q node.

To this end, the sensing unit 500 may include an analog-to-digital converter.

Next, as shown in FIG. 4, the controller 400 may include a data aligner 430 for realigning input image data Ri, Gi and Bi transmitted from an external system using a timing synchronization signal TSS transmitted from the external system and supplying the realigned image data Data to the data driver 300, a control signal generator 420 for generating a gate control signal GCS and a data control signal DCS by using the timing synchronization signal TSS, an input unit 410 for receiving the timing synchronization signal TSS and the input image data Ri, Gi and Bi transmitted from the external system and transmitting them to the data aligner 430 and the control signal generator 420, and an output unit 440 for outputting the image data Data generated from the data aligner 430 and the control signals DCS and GCS generated from the control signal generator 420 to the data driver 300 or the gate driver 200.

The controller 400 may serve to store the sensing data Sdata transmitted from the stages 500. To this end, the controller 400 may include a storage unit 450. However, the storage unit 450 may be provided in the light emitting display apparatus as an independent element.

The control signal generator 420 may further generate a control signal (hereinafter, simply referred to as a sensing unit control signal SCS) for controlling the sensing unit 500. The sampling signal SAM is included in the sensing unit control signal SCS.

Finally, the external system serves to drive the controller 400 and the electronic device. That is, when the electronic device is a smart phone, the external system receives various kinds of voice information, image information and text information through a wireless communication network, and transmits the received image information to the controller 400. The image information may be the input image data Ri, Gi and Bi.

Figure 5:
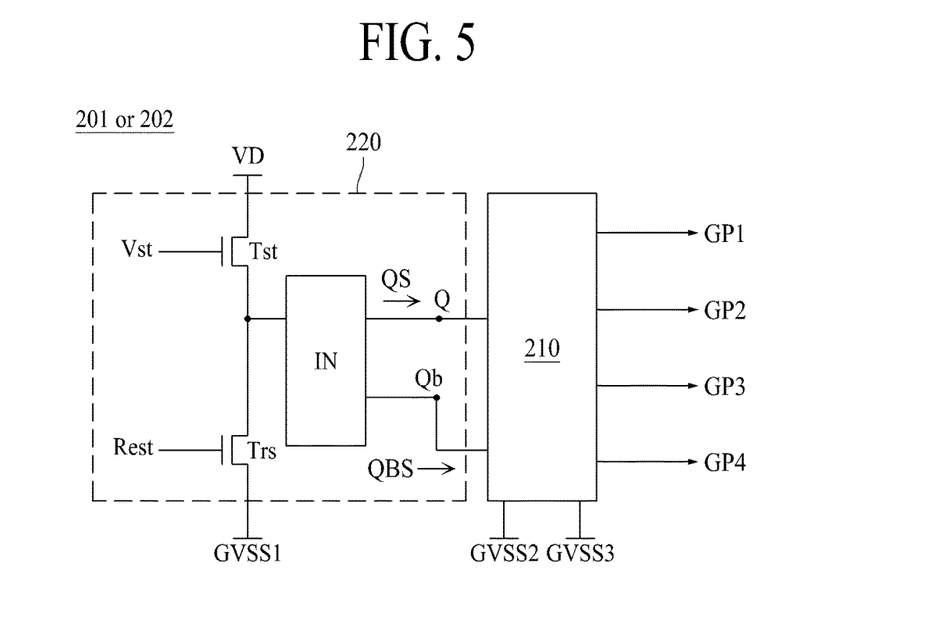
FIG. 5 is a schematic exemplary view illustrating a configuration of a stage or a dummy stage shown in FIG. 4.
Figure 6A:
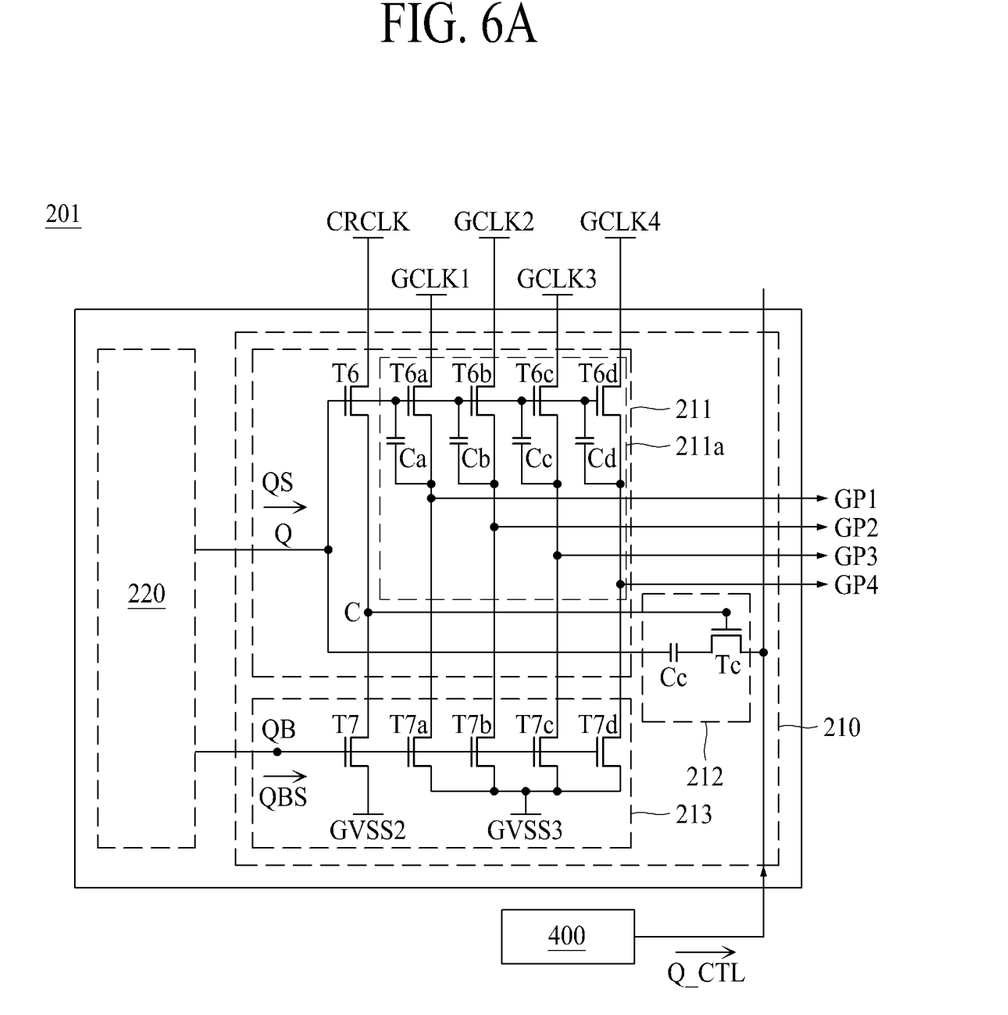
FIG. 6A is an exemplary view illustrating a connection relation between a stage and a controller, which are shown in FIGS. 4 and 5.
Figure 6B:
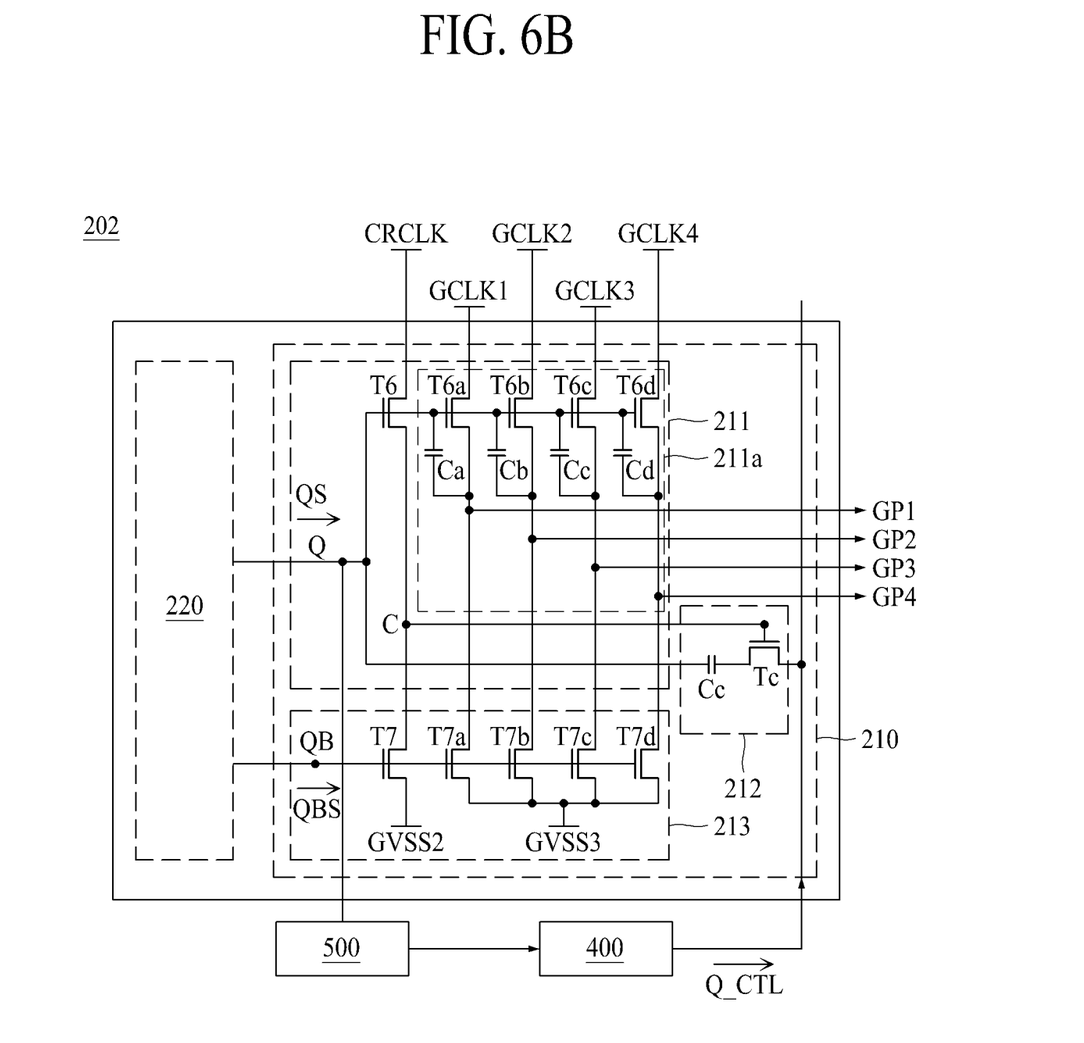
FIG. 6B is an exemplary view illustrating a connection relation between a dummy stage and a controller, which are shown in FIGS. 4 and 5.

FIG. 5 is a schematic exemplary view illustrating a configuration of a stage or a dummy stage shown in FIG. 4, FIG. 6A is an exemplary view illustrating a connection relation between a stage and a controller, which are shown in FIGS. 4 and 5, and FIG. 6B is an exemplary view illustrating a connection relation between a dummy stage and a controller, which are shown in FIGS. 4 and 5. Hereinafter, for convenience of description, as shown in FIG. 3, the stages 201 and the dummy stage 202, which sequentially output four gate pulses, will be described as an example of the present disclosure.

As described above, the gate driver 200 includes stages 201 (stage 1 to stage k) connected with the gate lines GL1 to GLg provided in the display area 102, and a dummy stage 202 connected with the dummy gate lines GLdm provided in the non-display area 103.

Each of the stage 201 and the dummy stage 202 may output at least two gate pulses, and may output four gate pulses GP1 to GP4, for example, as shown in FIG. 5. The four gate pulses GP1 to GP4 are included in four gate signals VG. That is, each of the four gate signals VG includes a gate pulse and a gate-off signal.

In particular, the four gate pulses GP1 to GP4 output from the stage 201 are output to four gate lines GL1 to GL4 adjacent to one another, and the four gate pulses GP1 to GP4 output from the dummy stage 202 are output to first to fourth dummy gate lines GLdm1 to GLdm4.

In order to perform the functions described as above, each of the stages 201 and the dummy stage 202 includes a signal generator 220 for generating a Q node signal QS and a QB node signal QBS having a phase opposite to that of the Q node signal QS, and a signal output unit 210 for sequentially at least two gate pulses in accordance with the Q node signal QS.

In particular, FIG. 5 shows a stage 201 or a dummy stage 202, which includes a signal generator 220 for generating a Q node signal QS supplied to a Q node Q and a QB node signal QBS having a phase opposite to that of the Q node signal QS to output four gate pulses GP1 to GP4, and a signal output unit 210 for sequentially outputting the four gate pulses GP1 to GP4 in accordance with the Q node signal QS, as an example of the present disclosure.

First, the signal generator 220 may include a plurality of transistors to generate the Q node signal QS and the QB node signal QBS, and FIG. 5 shows a signal generator 220 that includes two transistors Tst and Trs and an inverter IN to describe a basic structure and a basic function of the signal generator 220 applied to the present disclosure. That is, the signal generator 220 shown in FIG. 5 is schematically illustrated as an example of a signal generator applied to the present disclosure.

The start transistor Tst is turned on by a start signal Vst, and supplies a high voltage VD to the signal output unit 210 through the Q node Q. In this case, the start signal Vst may be a gate start signal transmitted from the controller 400, or may be a gate pulse GP transmitted from a previous stage. The gate pulses GP1 to GP4 may be output from the signal output unit 212 by the high voltage VD transmitted to the Q node. Therefore, the high voltage VD transmitted to the Q node may be the Q node signal QS. That is, among the signals transmitted to the Q node, a signal for allowing the gate pulses GP1 to GP4 to be output from the signal output unit 210 may be the Q node signal QS.

The high voltage VD that has passed through the start transistor Tst may be converted into a low voltage by the inverter IN and transmitted to a QB node QB. However, the inverter IN may convert another voltage other than the high voltage VD into a low voltage and transmit the low voltage to the QB node QB, or may transmit a low voltage applied from the outside to the QB node QB. Gate-off signals may be generated from the signal output unit 210 by the low voltage transmitted to the QB node QB. Therefore, the low voltage transmitted to the QB node QB may be the QB node signal QBS.

Also, the start signal Vst may be a carry signal output from the signal output unit 210 of any one of previous stages. For example, a first terminal to which the high voltage VD is applied from the start transistor Tst shown in FIG. 5 may be connected with a gate of the start transistor Tst. In this case, the carry signal output from a pre-previous stage may be input as the start signal Vst.

When the start transistor Tst is turned off and the reset transistor Trs is turned on by a reset signal Rest, a first low voltage GVSS1 may be supplied to the Q node Q through the reset transistor Trs.

The first low voltage GVSS1 may be converted into a high voltage by the inverter IN and then supplied to the QB node QB.

In more detail, the inverter IN may perform a function of supplying the high voltage VD or the first low voltage GVSS1 to the Q node Q, and may convert the high voltage VD or the first low voltage GVSS1 into a low voltage or a high voltage to supply the low voltage or the high voltage to the QB node QB. To this end, the inverter IN may be changed to various structures.

In order to perform the function described above, the signal generator 220 may include a basic structure as shown in FIG. 5. However, various modifications may be made in the structure and function of the signal generator 220 in addition to the structure and function described with reference to FIG. 5.

That is, the signal generator 220 may be formed in various structures so that the Q node signal QS supplied to the Q node Q and the QB node signal QBS having a phase opposite to that of the Q node signal QS may be generated to output at least two gate pulses.

The structure and function of the signal generator 220 described as above may commonly be applied to the stage 201 and the dummy stage 202.

Second, the signal output unit 210 serves to sequentially output at least two gate pulses.

To this end, as shown in FIGS. 6A and 6B, the signal output unit 210 includes a gate pulse output unit 211 for sequentially outputting at least two gate pulses in accordance with the Q node signal QS, a gate-off signal output unit 213 for outputting gate-off signals in accordance with the QB node signal QB S, and a compensation unit 212 for supplying the compensation signal Q_CTL transmitted from the controller 400 to the Q node Q.

The compensation unit 212 includes a compensation transistor Tc including a first terminal connected with the controller 400 and a gate connected with the gate pulse output unit 211 and a compensation capacitor Cc connected between a second terminal of the compensation transistor Tc and the Q node Q, wherein the compensation signal Q_CTL is supplied to the first terminal of the compensation transistor Tc.

The gate of the compensation transistor Tc is connected to a compensation control transistor T6 provided in the gate pulse output unit 211. Therefore, the compensation transistor Tc is turned on or off in accordance with the compensation control signal transmitted from the compensation control transistor T6. In particular, the compensation transistor Tc may be turned on by the compensation control transistor T6, and may be turned off by a turn-off compensation control transistor T7 provided in the gate-off signal output unit 213.

A first terminal of the compensation transistor Tc is connected with the controller 400, and the compensation signal Q_CTL is supplied from the controller 400 to the first terminal.

When the compensation transistor Tc is turned on in accordance with the compensation control signal, the compensation signal Q_CTL supplied to the first terminal is supplied to a second terminal of the compensation transistor Tc.

The second terminal of the compensation transistor Tc is connected with the compensation capacitor Cc.

A first terminal of the compensation capacitor Cc is connected to the Q node, and a second terminal of the compensation capacitor Cc is connected to the second terminal of the compensation transistor Tc.

Therefore, a voltage of the Q node Q may be changed in accordance with the compensation signal Q_CTL supplied to the compensation capacitor Cc through the compensation transistor Tc.

The compensation capacitor Cc may be a general capacitor, or may be a Mos Capacitor. When the compensation capacitor Cc is a Mos capacitor, a gate of the Mos capacitor may be connected with the second terminal of the compensation transistor Tc, and first and second terminals of the Mos capacitor may be connected to the Q node Q.

Next, the gate pulse output unit 211 includes a sequential driver 211a that includes a compensation control transistor T6 turned on in accordance with the Q node signal QS, controlling turn-on or turn-off of the compensation transistor Tc and at least two gate transistors turned on in accordance with the Q node signal, sequentially outputting at least two gate pulses by using at least two gate clocks. The sequential driver 211a that includes four gate transistors T6a to T6d turned on in accordance with the Q node signal QS, sequentially outputting four gate pulses GP1 to GP4 by using four gate clocks GCLK1 to GCLK4 is shown in FIGS. 6A and 6B as an example of a sequential driver applied to the present disclosure.

The compensation control transistor T6 includes a gate connected with the Q node Q, a first terminal to which a compensation control clock CRCLK is supplied and a second terminal connected with the gate of the compensation transistor Tc. The second terminal is connected with a C node C. The compensation control transistor T6 is turned on in accordance with the Q node signal QS.

That is, the gate of the compensation control transistor T6 is connected to the Q node Q, and the compensation control clock CRCLK is input to the first terminal of the compensation control transistor T6, and the second terminal of the compensation control transistor T6 is connected to the gate of the compensation transistor Tc through the C node C.

Therefore, the compensation transistor Tc is turned on or off by the compensation control clock CRCLK.

In this case, a signal output from the compensation control transistor T6 may be a carry signal. For example, a carry signal output from an (n)th stage may be supplied to a start signal Vst of a (n+2)th stage. That is, the C node C is connected with the compensation transistor Tc, and the carry signal output from the C node C may be supplied to another stage and become the start signal Vst.

Gates of the four gate transistors T6a to T6d provided in the sequential driver 211a are connected to the Q node Q. Therefore, the four gate transistors T6a to T6d are turned on by the Q node signal QS.

The first to fourth gate clocks GCLK1 to GCLK4 are input to the first terminals of the four gate transistors T6a to T6d provided in the sequential driver 211a.

The second terminals of the four gate transistors T6a to T6d provided in the sequential driver 211a are connected to four gate lines GL. Four gate pulses GP1 to GP4 are sequentially output to the four gate lines GL.

That is, the four gate transistors T6a to T6d may be turned on at the same time by the Q node signal QS, and the four gate pulses GP1 to GP4 may sequentially be output by the first to fourth gate clocks GCLK1 to GCLK4 sequentially input to the four gate transistors T6a to T6d.

In more detail, the sequential driver 211a includes a first gate transistor T6a including a gate connected to the Q node Q, a first terminal to which the first gate clock GCLK1 is supplied and a second terminal to which the first gate pulse GP1 is output, and an (n)th gate transistor T6d including a gate connected with the Q node Q, a first terminal to which an (n)th gate clock is supplied and a second terminal to which an (n)th gate pulse is output, wherein 'n' may be a natural number greater than or equal to 2. In particular, 'n' may be 4 in the sequential driver 211a shown in FIGS. 6A and 6B.

In this case, a capacitor is connected between the gate and the second terminal (gate line) of each of the four gate transistors T6a to T6d.

For example, a first capacitor Ca is connected to the gate and the second terminal of the first gate transistor T6a, a second capacitor Cb is connected to the gate and the second terminal of the second gate transistor T6b, a third capacitor Cc is connected to the gate and the second terminal of the third gate transistor T6c, and a fourth capacitor Cd is connected to the gate and the second terminal of the fourth gate transistor T6d.

Each of the first to fourth capacitors Ca to Cd serves to uniformly maintain a voltage between the gate and the source of each of the first to fourth gate transistors T6a to T6d.

Finally, the gate-off signal output unit 213 outputs gate-off signals in accordance with the QB node signal QBS. The gate-off signal means a signal for turning off the switching transistor Tsw1 provided in the pixel driving unit PDU.

As shown in FIGS. 6A and 6B, the gate-off signal output unit 213 includes a turn-off compensation control transistor T7 turned on in accordance with the QB node signal QBS, controlling turn-on or turn-off of the compensation transistor Tc, in particular, turn-off of the compensation transistor Tc, and at least two off-transistors turned on in accordance with the QB node signal QBS, outputting at least two gate-off signals. The gate-off signal output unit 213 that includes four off-transistors T7a to T7d turned on in accordance with the QB node signal QBS, outputting four gate-off signals is shown in FIGS. 6A and 6B as an example of a gate-off signal output unit applied to the present disclosure.

The turn-off compensation control transistor T7 includes a gate connected to a QB node QB, a first terminal connected to a second low voltage GVSS2 and a second terminal connected to a gate of the compensation transistor Tc.

When the turn-off compensation control transistor T7 is turned on by the QB node signal QBS, the second low voltage GVSS2 is supplied to the gate of the compensation transistor Tc. Therefore, the compensation transistor Tc is turned off.

Each of the four off-transistors T7a to T7d includes a gate connected to the QB node QB, a first terminal connected to a third low voltage GVSS3 and a second terminal connected to the gate line GL.

When the four off-transistors T7a to T7d are turned on by the QB node signal QBS, the gate-off signals are supplied to the four gate lines by the third low voltage GVSS3.

The first low voltage GVSS1, the second low voltage GVSS2 and the third low voltage GVSS3 may all be the same voltages or may all be voltages different from one another, wherein at least two voltages may be the same voltages.

The above description may be applied to both the stage 201 and the dummy stage 202.

A difference between the stage 201 and the dummy stage 202 is in whether they are connected to the sensing unit 500. That is, the sensing unit 500 is not connected to the stage 201 as shown in FIG. 6A, and the sensing unit 500 is connected to the dummy stage 202 as shown in FIG. 6B.

That is, FIG. 6A shows the stage 201, and FIG. 6B shows the dummy stage 202. The sensing unit 500 is connected to the Q node Q of the dummy stage 202.

In more detail, the configuration and function of the stage 201 shown in FIG. 6A is the same as those of the dummy stage 202 shown in FIG. 6B. However, the stage 201 is connected with the gate lines provided in the display area, and the dummy stage 202 is connected with the dummy gate lines provided in the non-display area. Also, although the stage 201 is not connected with the sensing unit 500, the dummy stage 202 is connected with the sensing unit 500. In this case, both the stage 201 and the dummy stage 202 are connected with the controller 400, and the compensation signal Q_CTL may be supplied from the controller 400.

Hereinafter, a method of sensing a dummy stage 202 and supplying a compensation signal to stages 201 and the dummy stage 202 in the light emitting display apparatus according to the present disclosure will be described with reference to FIGS. 1 to 8. In the following description, elements the same as or similar to those described with reference to FIGS. 1 to 6 will be omitted or briefly described.

Figure 7:
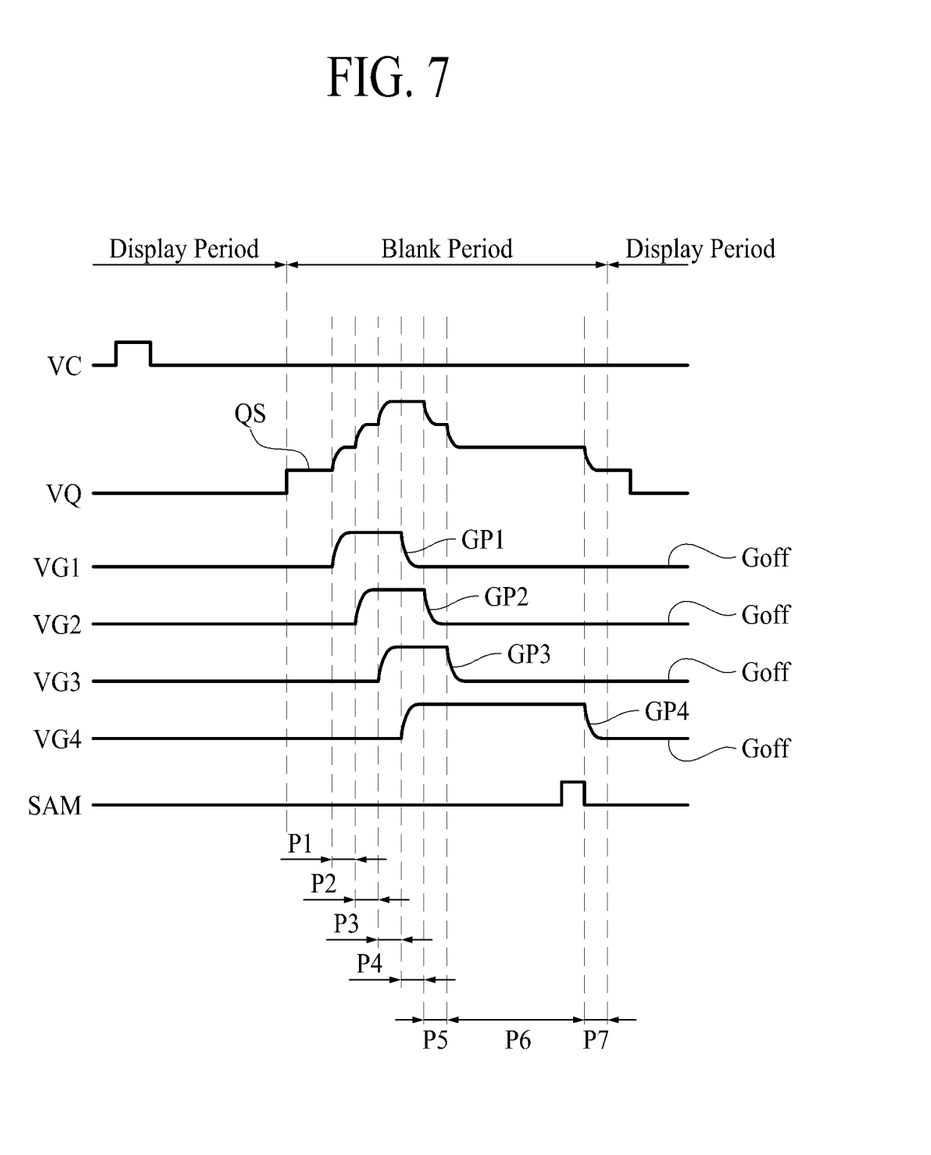
FIG. 7 illustrates waveforms for describing a method of sensing a dummy stage in a light emitting display apparatus according to the present disclosure.

FIG. 7 illustrates waveforms to describe a method of sensing a dummy stage in a light emitting display apparatus according to the present disclosure.

As described above, the light emitting display apparatus according to the present disclosure includes a gate driver 200 including stages 201 connected with the gate lines GL provided in the display area 102 and a dummy stage 202 connected with the dummy gate lines GLdm provided in the non-display area 103, a sensing unit 500 connected with the dummy stage 202 connected with at least two dummy gate lines GLdm provided in the non-display area 103, and a controller 500 connected with the sensing unit 500.

The dummy stage 202 sequentially outputs at least two gate pulses. In the following description, the dummy stage 202 sequentially outputs four gate pulses GP1 to GP4.

The sensing unit 500 senses a characteristic change of the Q node Q to which the Q node signal QS is supplied, wherein the Q node signal QS is to allow the gate pulses to be output from the dummy stage 202. The sensing unit 500 senses a voltage change of the Q node.

The controller 400 generates a compensation signal Q_CTL according to the characteristic change and supplies the compensation signal Q_CTL to the stages 201. The compensation signal Q_CTL may be supplied to the dummy stage 202.

In this case, the sensing unit 500 is connected to the Q node Q of the dummy stage 202.

That is, as shown in FIG. 7, at a blank period between display periods, the sensing unit 500 senses the voltage of the Q node Q of the dummy stage 202 in accordance with the sampling signal SAM transmitted from the controller 400.

In particular, the sensing unit 500 may sense the voltage of the Q node Q of the dummy stage 202 at a timing when the (n)th gate pulse of the first to (n)th gate pulses output from the dummy stage 202 is output. That is, the sensing unit 500 may sense the voltage of the Q node Q of the dummy stage 202 at the timing when the fourth gate pulse GP4, which is the last gate pulse of the first to fourth gate pulses GP1 to GP4, is output.

In this case, a width of the (n)th gate pulse is greater than that of the first to (n−1)th gate pulses. That is, a width of the fourth gate pulse GP4, which is the last gate pulse of the first to fourth gate pulses GP1 to GP4, is greater than that of the first to third gate pulses GP1 to GP3. Also, the sampling signal SAM is supplied to the sensing unit 500 at a timing corresponding to an end of the fourth gate pulse GP4.

As shown in FIG. 7, when the sampling signal SAM is supplied to the sensing unit 500 at a timing corresponding to the end of the fourth gate pulse GP4, the voltage of the Q node Q (hereinafter, simply referred to as Q node voltage VQ) may sufficiently be affected by the first to fourth gate pulses GP1 to GP4 to finally maintain a stable voltage. When the Q node voltage VQ is sensed at the timing that the Q node voltage VQ maintains a stable voltage, a state of the Q node Q may exactly be sensed.

In this case, in order to calculate the characteristic change of the Q node Q, that is, the voltage change, the sensing unit 500 may sense the voltage of the Q node Q of the dummy stage 202 at each of the timing when the (n−1)th gate pulse of the first to (n)th gate pulses output from the dummy stage 202 is output and the timing when the (n)th gate pulse is output. That is, the sensing unit 500 may sense the voltage of the Q node Q of the dummy stage 202 at each of the timing when the third gate pulse GP3 of the first to fourth gate pulses GP1 to GP4 output from the dummy stage 202 is output and the timing when the fourth gate pulse GP4 is output.

That is, as shown in FIG. 7, when the Q node voltage VQ is sensed only at the timing when the fourth gate pulse GP4 is output, the Q node voltage VQ by the first to third gate pulses GP1 to GP3 cannot be sensed exactly. However, when the Q node voltage VQ is further sensed in the timing at which the third gate pulse GP3 is output, the Q node voltage VQ by the first to third gate pulses GP1 to GP3 may be exactly sensed. Further, when the Q node voltage VQ is further sensed in the timing at which the second gate pulse GP2 is output, the Q node voltage VQ by the first and second gate pulses GP1 and GP2 may exactly be sensed.

That is, when the Q node voltage VQ is sensed for each gate pulse, a change in the Q node voltage VQ may be sensed more exactly, and thus a more exact compensation signal Q_CTL may be generated.

Hereinafter, the sensing method described above will be described in detail with reference to FIG. 7.

First, at the display period, the stages stage 1 to stage k and the dummy stage 202, which are shown in FIG. 3, are sequentially driven to sequentially output gate pulses to the gate lines GL1 to GLg and the dummy gate lines GLdm1 to GLdm4.

Therefore, the transistors provided in the stages 201 and the transistors provided in the dummy stage 202 are degraded at almost the same state. That is, the degraded degree of the dummy stage 202 may be maintained almost similar to the degraded degree of the stage 201.

When the blank period starts after the display period, gate pulses are no longer output to the gate lines and the dummy gate lines. That is, at a blank period at which sensing of the dummy stage 202 is not performed, the stages 201 and the dummy stage 202 are not driven.

Since the stage 201 is not degraded in a short period, a sensing operation for the dummy stage 202 does not need to be performed every frame period.

Therefore, the sensing operation for the dummy stage 202 may be performed when there is a request by a manufacturer of a light emitting display apparatus, a user who uses the light emitting display apparatus, or a worker who repairs the light emitting display apparatus, or may be performed at a timing (e.g., after 1000 hours or 10000 hours pass) preset by the manufacturer. However, for convenience of description, the light emitting display apparatus in which the sensing operation for the dummy stage 202 is performed every blank period of every frame period will be described as an example of the present disclosure.

Next, when a blank period at which sensing for the dummy stage 202 is performed starts, the controller 400 transmits a reset signal to the signal generator 220.

By the reset signal, the signal generator 220 generates the Q node signal QS and transmits the Q node signal QS to the Q node Q.

Therefore, the compensation control transistor T6 and the four gate transistors T6a to T6d of the gate pulse output unit 211 are turned on by the Q node signal QS.

Therefore, the Q node voltage VQ becomes a voltage corresponding to the Q node signal QS.

In this case, a C node voltage VC having a low level is supplied to the C node C of the gate pulse output unit 211, that is, the gate of the compensation transistor Tc. Therefore, the compensation transistor Tc is turned off.

In more detail, the dummy stage 202 is sequentially driven together with the stages 201 at the display period to output four gate pulses, and at the blank period, is driven by the reset signal, and the Q node signal QS is supplied to the Q node.

Therefore, the Q node voltage VQ is changed to a voltage corresponding to the Q node signal QS, and the first to fourth gate transistors T6a to T6d are turned on.

Next, in a state that the first gate transistor T6a is turned on, when the first gate clock GCLK1 having a high level is supplied to the first terminal of the first gate transistor T6a at a first period P1, the first gate pulse GP1 is output to the second terminal of the first gate transistor T6a, that is, the first dummy gate line GLdm1. In this case, the Q node voltage VQ is coupled to the first gate clock GCLK1 and then rises.

Next, in a state that the second gate transistor T6b is turned on, when the second gate clock GCLK2 having a high level is supplied to the first terminal of the second gate transistor T6b at a second period P2, the second gate pulse GP2 is output to the second terminal of the second gate transistor T6b, that is, the second dummy gate line GLdm2. In this case, the Q node voltage VQ is coupled to the second gate clock GCLK2 and further rises.

Next, in a state that the third gate transistor T6c is turned on, when the third gate clock GCLK3 having a high level is supplied to the first terminal of the third gate transistor T6c at a third period P3, the third gate pulse GP3 is output to the second terminal of the third gate transistor T6c, that is, the third dummy gate line GLdm3. In this case, the Q node voltage VQ is coupled to the third gate clock GCLK3 and further rises.

Next, in a state that the fourth gate transistor T6d is turned on, when the fourth gate clock GCLK4 having a high level is supplied to the first terminal of the fourth gate transistor T6d at a fourth period P4, the fourth gate pulse GP4 is output to the second terminal of the fourth gate transistor T6d, that is, the fourth dummy gate line GLdm4.

In this case, the first gate clock GCLK1 having a high level is changed to a low level. Therefore, the first gate pulse GP1 is also changed to a low level.

In this case, the Q node voltage VQ is coupled to the fourth gate clock GCLK4 having a high level and rises, but at the same time, is coupled to the first gate clock GCLK1 having a low level and falls. Therefore, the Q node voltage VQ does not rise or fall at the timing when the fourth gate clock GCLK4 is output. That is, the Q node voltage VQ of the timing at which the fourth gate clock GCLK4 is output is maintained at the Q node voltage VQ of the timing at which the third gate clock GCLK3 is output.

Next, at a fifth period P5, as the second gate clock GCLK2 having a high level is changed to a low level, the Q node voltage VQ is coupled to the second gate clock GCLK2 having a low level and falls. In this case, the second gate pulse GP2 is also changed to a low level.

Next, at a sixth period P6, as the third gate clock GCLK3 having a high level is changed to a low level, the Q node voltage VQ is coupled to the third gate clock GCLK3 having a low level and further falls. In this case, the third gate pulse GP3 is also changed to a low level.

Next, the fourth gate clock GCK4 having a high level supplied to the fourth gate transistor T6d at the fourth period P4 is maintained at a high level even at the sixth period P6. That is, as described above, a width of the fourth gate pulse GP4 is greater than that of the first to third gate pulses GP1 to GP3, which means that a width of the fourth gate clock GCLK4 is greater than that of the first to third gate clocks GCLK1 to GCLK3.

Next, the controller 400 supplies the sampling signal SAM to the sensing unit 500 at the timing corresponding to the end of the fourth gate pulse GP4, for example, just before the fourth gate clock GCLK4 falls.

Therefore, in the sensing unit 500, the Q node voltage VQ of the timing at which the fourth gate pulse GP4 is output is sensed.

The sensed voltage is converted into a digital sensing data Sdata, and the sensing data Sdata is transmitted to the controller 400.

Finally, at a seventh period P7, as the fourth gate clock GCLK4 having a high level is changed to a low level, the Q node voltage VQ is coupled to the fourth gate clock GCLK4 having a low level and further falls. In this case, the fourth gate pulse GP4 is also changed to a low level. Therefore, after the seventh period P7, the gate-off signals Goff are supplied to the first to fourth dummy gate lines GLdm1 to GLdm4.

The controller 400 may extract the Q node voltage when the fourth gate clock GCLK4 is supplied during the sixth period P6, by using the sensing data Sdata.

The Q node voltage VQ of the fourth period P4 may be predicted using the Q node signal QS and levels of the first to fourth gate clocks GCLK1 to GCLK4. In addition, the change amount of the Q node voltage VQ according to the falling of the fourth gate clock GCK4 at the seventh period may be predicted using the Q node voltage VQ of the sixth period and the level of the fourth gate clock GCLK4.

Therefore, the controller 400 may determine a changed level of the Q node voltage VQ and a changed state of the Q node voltage VQ at the fifth to seventh periods P5 to P7 by using the sensing data Sdata and predictable information.

At the fifth to seventh periods P5 to P7, the controller 400 may generate a compensation signal Q_CTL capable of maintaining the Q node voltage VQ at the fifth to seventh periods P5 to P7 as the Q node voltage VQ of the third period P3 and the fourth period, that is, a maximum value of the Q node voltage VQ by using the changed level and the changed state of the Q node voltage VQ.

The generated compensation signal Q_CTL may be stored in the storage unit 450.

In this case, in order to generate the more exact compensation signal Q_CTL, the controller 400, as described above, may further sense the Q node voltage VQ at the fifth period P5 at which the third gate clock GCLK3 is maintained at a high level, may further sense the Q node voltage VQ at the fourth period P4 at which the second gate clock GCLK2 is maintained at a high level and may further sense the Q node voltage VQ at the third period P3 at which the first gate clock GCLK1 is maintained at a high level.

When the Q node voltage VQ is further sensed at the third to fifth periods P3 to P5, each of the third to fifth periods P3 to P5 may be extended like the sixth period P6, which means that the period at which the first to third gate clocks GCLK1 to GCLK3 are maintained at a high level is extended.

When the Q node voltage VQ is further sensed at the fifth period P5 and the sixth period P6, the controller 400 may continuously transmit the sampling signal SAM to the sensing unit 500 at the fifth period P5 and the sixth period P6.

However, the controller 400 may transmit the sampling signal SAM to the sensing unit 500 only at the fifth period P5 to sense the Q node voltage VQ at the fifth period P5, and then may not transmit the sampling signal SAM at the sixth period and the seventh period. Afterwards, the controller 400 may transmit the reset signal RESET to the dummy stage 202, so that the operation of the first to seventh periods P1 to P7 may be performed again. In this case, the controller 400 may transmit the sampling signal SAM to the sensing unit 500 at the sixth period P6 to sense the Q node voltage VQ at the sixth period P6.

That is, the controller 400 may sequentially sense the Q node voltages VQ of the third to sixth periods P3 to P6 during the third to sixth periods P3 to P6 that are continuously generated. Otherwise, the controller 400 may sense one Q node voltage VQ at the third to sixth periods P3 to P6 generated by one reset signal and then sense another Q node voltage VQ at the third to sixth periods P3 to P6 generated by another reset signal.

The compensation signal Q_CTL is a signal that allows the voltage of the Q node when the gate pulses are output from the dummy stage 202 to be a maximum value of the voltages of the Q node when the gate pulses are output. In addition, the compensation signal Q_CTL is a signal that allows the voltage of the Q node when the gate pulses are output from the stage 201 to be the maximum value of the voltages of the Q node when the gate pulses are output.

This will be described with reference to FIG. 8.

Figure 8:
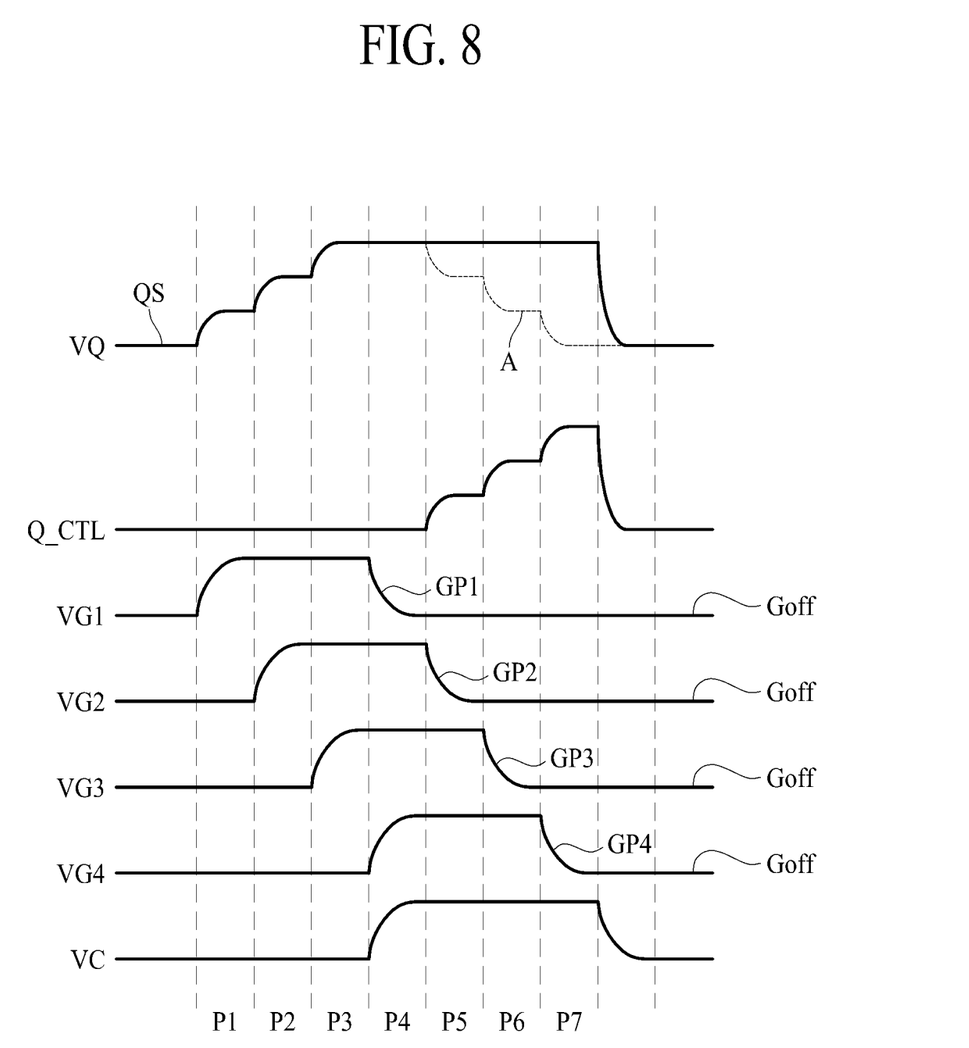
FIG. 8 illustrates waveforms for describing a method of supplying a compensation signal in a light emitting display apparatus according to the present disclosure.

FIG. 8 illustrates waveforms to describe a method of supplying a compensation signal in a light emitting display apparatus according to one aspect of the present disclosure.

As described with reference to FIG. 7, the compensation signal Q_CTL may be generated by the controller 400 by sensing the Q node voltage VQ when the gate pulses are output from the dummy stage 202.

The controller 400 generates the compensation signal Q_CTL for allowing the Q node voltage VQ when the gate pulses GP1 to GP4 are output from the dummy stage 202 to be the maximum value among the Q node voltages VQ when the gate pulses GP1 to GP4 are output, by using the sensing data Sdata transmitted from the sensing unit 500, and supplies the compensation signal Q_CTL to the stages. The compensation signal Q_CTL may be supplied to the dummy stage 202.

That is, the controller 400 extracts the Q node voltages VQ at periods at which the second to (n)th gate pulses of the first to (n)th gate pulses output from the dummy stage 202 are output, by using at least one sensing signal sensed by the Q node Q of the dummy stage 202. The controller 400 generates a compensation signal to maintain the Q node voltage VQ when the gate pulses are output at a maximum value among the Q node voltages VQ when the gate pulses are output, by using the extracted voltages. The controller 400 may supply the generated compensation signal to the stages 201 and the dummy stage 202.

In this case, the controller 400 may supply the compensation signal to the stages 201 at the periods at which the second to (n)th gate pulses of the first to the (n)th gate pulses output from each of the stages 201 fall.

The above features will be described in detail with reference to FIG. 8. In this case, the first period P1 to the seventh period P7 described below correspond to the first period P1 to the seventh period P7 used in the description of FIG. 7.

First, when the Q node signal QS is supplied to the Q node Q, the first to fourth gate transistors T6a to T6d are turned on.

In this case, the Q node voltage VQ corresponds to the Q node signal QS.

Next, in a state that the first gate transistor T6a is turned on, when the first gate clock GCLK1 having a high level is supplied to the first terminal of the first gate transistor T6a at the first period P1, the first gate pulse GP1 is output to the second terminal of the first gate transistor T6a. In this case, the Q node voltage VQ is coupled to the first gate clock GCLK1 and rises.

Next, in a state that the second gate transistor T6b is turned on, when the second gate clock GCLK2 having a high level is supplied to the first terminal of the second gate transistor T6b at the second period P2, the second gate pulse GP2 is output to the second terminal of the second gate transistor T6b. In this case, the Q node voltage VQ is coupled to the second gate clock GCLK2 and further rises.

Next, in a state that the third gate transistor T6c is turned on, when the third gate clock GCLK3 having a high level is supplied to the first terminal of the third gate transistor T6c at the third period P3, the third gate pulse GP3 is output to the second terminal of the third gate transistor T6c. In this case, the Q node voltage VQ is coupled to the third gate clock GCLK3 and further rises.

Next, in a state that the fourth gate transistor T6d is turned on, when the fourth gate clock GCLK4 having a high level is supplied to the first terminal of the fourth gate transistor T6d at the fourth period P4, the fourth gate pulse GP4 is output to the second terminal of the fourth gate transistor T6d.

In this case, the first gate clock GCLK1 having a high level is changed to a low level. Therefore, the first gate pulse GP1 is also changed to a low level.

In this case, the Q node voltage VQ is coupled to the fourth gate clock GCLK4 having a high level and rises, but at the same time, is coupled to the first gate clock GCLK1 having a low level and falls. Therefore, the Q node voltage VQ does not rise at the timing when the fourth gate clock GCLK4 is output. That is, the Q node voltage VQ of the timing at which the fourth gate clock GCLK4 is output is maintained at the Q node voltage VQ of the timing at which the third gate clock GCLK3 is output.

Therefore, the Q node voltage VQ of the fourth period P4 at which the fourth gate clock GCLK4 is output has a maximum value among the first to fourth periods P1 to P4.

When the compensation signal Q_CTL is not supplied to the Q node Q, as the second gate clock GCLK2 having a high level is changed to a low level at the fifth period P5, the Q node voltage VQ is coupled to the second gate clock GCLK2 having a low level and falls. Also, as third gate clock GCLK3 having a high level is changed to a low level at the sixth period P6, the Q node voltage VQ is coupled to the third gate clock GCLK3 having a low level and further falls. In addition, as the fourth gate clock signal GCLK4 having a high level is changed to a low level at the seventh period P7, the Q node voltage is coupled to the fourth gate clock signal GCLK4 having a low level and further falls.

When the compensation signal Q_CTL is not supplied to the Q node Q, the Q node voltage VQ of the fifth to seventh periods P5 to P7 is marked with A in FIG. 8.

That is, when the compensation signal Q_CTL is not supplied to the Q node Q, the Q node voltage VQ at the fifth to seventh periods P5 to P7 gradually falls from the maximum value at the fourth period P4.

That is, when the compensation signal Q_CTL is not supplied to the Q node Q, the magnitude of the Q node voltage VQ is different at the fifth to seventh periods P5 to P7. The Q node voltage VQ is the voltage of the gate of each of the first to fourth gate transistors T6a to T6d.

Therefore, the case that the magnitude of the Q node voltage VQ is different at the fifth to seventh periods P5 to P7 means that gate and source voltages of the first to fourth gate transistors T6a to T6d at the fifth to seventh periods P5 to P7 are different from one another.

When the gate and source voltages of the first to fourth gate transistors T6a to T6d are changed at the timing at which the first to fourth gate pulses GP1 to GP4 fall, periods at which the first to fourth gate pulses GP1 to GP4 fall are different from one another. For example, the period at which the first gate pulse GP1 falls may be the shortest, and the period at which the fourth gate pulse GP4 falls may be the longest.

The case that the periods at which the gate pulses fall are different from one another means that a deviation occurs in the gate pulses, which may cause a deviation in luminance of light output from the pixels.

In order to solve this problem, a method of forming the second gate transistor T6b to be larger than the first gate transistor T6a, forming the third gate transistor T6c to be larger than the second gate transistor T6b and forming the fourth gate transistor T6d to be larger than the third gate transistor T6c may be used.

However, according to this method, since the sizes of the gate transistors T6a to T6d should be manufactured differently, there is a difficulty in design. In addition, even though the sizes of the gate transistors are different from one another, the above problems cannot be solved completely. When the light emitting display apparatus is used for a long time even though the sizes of the gate transistors are different from one another, characteristics of the gate transistors may be changed, whereby another deviation may occur between the gate pulses output from the respective gate transistors.

In order to solve these problems, the light emitting display apparatus according to the present disclosure senses a change in the Q node voltage VQ of the dummy stage 202, generates a compensation signal Q_CTL by using the sensing data Sdata generated by sensing and supplies the compensation signal Q_CTL to the Q node Q at a timing at which the Q node voltage VQ of the stage 201 falls from the maximum value at the display period.

In the above example, when the compensation signal Q_CTL is not supplied, as shown in FIG. 8, the Q node voltage VQ has a maximum value at the fourth period P4 and gradually falls from the fifth period P5 to the seventh period P7, like a waveform marked with A.

Therefore, the controller 400 supplies the compensation signal Q_CTL to the Q node Q of the stage 201 during the fifth period P5 to the seventh period P7.

To this end, the controller 400 supplies the compensation control clock CRCLK having a high level to the compensation control transistor T6 at the fourth period P4 to the seventh period P7, and transmits the compensation signal Q_CTL to the compensation transistor Tc at the fifth period P5 to the seventh period P7.

That is, at the fourth period P4 to the seventh period P7, a C node voltage VC having a high level is supplied to the gate of the compensation transistor Tc by the compensation control clock CRCLK having a high level as shown in FIG. 8. Therefore, the compensation transistor Tc is turned on at the fourth period P4 to the seventh period P7. The C node voltage VC is the voltage of the C node C, and the C node C corresponds to the gate of the compensation transistor Tc.

Since the compensation transistor Tc is turned on at the fourth period P4 to the seventh period P7, the compensation signal Q_CTL supplied to the first terminal of the compensation transistor Tc may be supplied to the compensation capacitor Cc during the fifth period P5 to the seventh period P7. Therefore, the voltage of the Q node connected with the compensation capacitor Cc may rise by being coupled to the compensation signal Q_CTL.

In other words, as shown in FIG. 8, by the compensation signal Q_CTL supplied to the first terminal of the compensation transistor Tc during the fifth period P5 to the seventh period P7, the Q node voltage VQ may be maintained at the maximum value of the fourth period P4 during the fifth period P5 to the seventh period P7.

In more detail, the compensation signal Q_CTL is a signal that allows the voltage of the Q node when the gate pulses GP1 to GP4 are output from the stage 201 to be the maximum value of the voltages of the Q node when the gate pulses GP1 to GP4 are output. That is, as the compensation signal Q_CTL is added to the Q node voltages (waveform marked with A of FIG. 8) sequentially falling in accordance with falling of the first to fourth gate clocks GCLK1 to GCLK4 during the fifth to seventh periods P5 to P7, the actual voltage of the Q node voltage VQ at the fifth to seventh periods P5 to P7 may be maintained at the maximum value of the fourth period P4, as shown by solid lines in FIG. 8.

At the fifth to seventh periods P5 to P7, the voltage of the gates of the first to fourth gate transistors T6a to T6d, that is, the Q node voltage VQ may uniformly be maintained. Therefore, during the fourth to seventh periods P4 to P7 at which the first to fourth gate clocks GCLK1 to GCLK4 or the first to fourth gate pulses GP1 to GP4 fall, the gate and source voltages of the first to fourth gate transistors T6a to T6d may be constant values.

Therefore, the periods at which the first to fourth gate pulses GP1 to GP4 fall may uniformly be maintained, and thus no deviation occurs in the first to fourth gate pulses GP1 to GP4.

Therefore, no deviation occurs in light output from the pixels by the first to fourth gate pulses GP1 to GP4, whereby quality of the light emitting display apparatus may be improved.

That is, according to the present disclosure described as above, no deviation occurs between at least two gate pulses output from one stage 201, whereby quality of the light emitting display apparatus may be improved.

According to the present disclosure, the following advantageous effects may be obtained.

According to the present disclosure, at least two gate pulses may sequentially be output from a stage constituting a gate driver, a voltage change of a Q node to which a Q node signal for allowing gate pulses to be output is supplied may be sensed, and a compensation signal capable of compensating for the voltage change may be supplied to the stage.

Therefore, according to the present disclosure, the output deviation between at least two gate pulses output from one stage may be reduced.

That is, in the present disclosure, the voltage of the Q node of the stage may uniformly be maintained when at least two gate pulses are output from one stage, whereby the output deviation of at least two gate pulses may be reduced.

In addition, when the voltage of the Q node is uniformly maintained, the sizes of the transistors to which at least two gate pulses are output may be designed to be equal to each other, whereby defects caused by the process variation of the transistors may be reduced.

In addition, since the voltage change of the Q node may be sensed and thus compensation based on the voltage change may be performed, lifetime of the light emitting display apparatus may be improved.

It will be apparent to those skilled in the art that the present disclosure described above is not limited by the above-described aspects and the accompanying drawings and that various substitutions, modifications and variations can be made in the present disclosure without departing from the spirit or scope of the disclosures. Consequently, the scope of the present disclosure is defined by the accompanying claims and it is intended that all variations or modifications derived from the meaning, scope and equivalent concept of the claims fall within the scope of the present disclosure.

What is claimed is:

1. A light emitting display apparatus comprising:
a gate driver including a plurality of stages connected with a plurality of gate lines provided in a display area and a dummy stage connected with a plurality of dummy gate lines provided in a non-display area;
a sensing unit connected with the dummy stage connected with at least two dummy gate lines provided in the non-display area; and
a controller connected with the sensing unit,
wherein each of the plurality of stages sequentially outputs at least two gate pulses to at least two gate lines, and each of the at least two gate lines is connected to a switching transistor provided in the display area,
wherein the dummy stage sequentially outputs at least two gate pulses to the at least two dummy gate lines,
wherein the sensing unit senses a voltage of a Q node to which a Q node signal for allowing the at least two gate pulses to be output from the dummy stage is supplied,
wherein the controller supplies a compensation signal based on the voltage of the Q node to the plurality of stages,
wherein each of the plurality of stages and the dummy stage includes a signal output unit for sequentially outputting at least two gate pulses in accordance with the Q node signal, and
wherein the signal output unit includes:
a compensation transistor including a first terminal connected with the controller and supplied with a compensation signal transmitted from the controller to the Q node; and
a compensation capacitor connected between a second terminal of the compensation transistor and the Q node.

2. The light emitting display apparatus of claim 1, wherein each of the plurality of stages and the dummy stage includes:
a signal generator for generating the Q node signal supplied to the Q node to output at least two gate pulses and generating a QB node signal having a phase opposite to that of the Q node signal; and the signal output unit, and
wherein the signal output unit includes:
a gate pulse output unit for sequentially outputting at least two gate pulses in accordance with the Q node signal;
a gate-off signal output unit for outputting gate-off signals in accordance with the QB node signal; and
a compensation unit for supplying the compensation signal transmitted from the controller to the Q node, the compensation unit including the compensation transistor and the compensation capacitor.

3. The light emitting display apparatus of claim 2, wherein the compensation transistor further includes a gate connected with the gate pulse output unit.

4. The light emitting display apparatus of claim 3, wherein the gate pulse output unit includes:
a compensation control transistor turned on in accordance with the Q node signal, controlling turn-on or turn-off of the compensation transistor; and
a sequential driver including at least two transistors turned on in accordance with the Q node signal and sequentially outputting at least two gate pulses by using at least two gate clocks.

5. The light emitting display apparatus of claim 4, wherein the compensation control transistor includes:
a gate connected with the Q node;
a first terminal to which a compensation control clock is supplied; and
a second terminal connected with a gate of the compensation transistor.

6. The light emitting display apparatus of claim 4, wherein the sequential driver includes:

a first gate transistor including a gate connected with the Q node, a first terminal to which a first gate clock is supplied and a second terminal to which a first gate pulse is output; and an (n)th gate transistor including a gate connected with the Q node, a first terminal to which an (n)th gate clock is supplied and a second terminal to which an (n)th gate pulse is output.

7. The light emitting display apparatus of claim 1, wherein the sensing unit is connected with the Q node of the dummy stage.

8. The light emitting display apparatus of claim 1, wherein the sensing unit senses the voltage of the Q node of the dummy stage in accordance with a sampling signal transmitted from the controller at a blank period between display periods.

9. The light emitting display apparatus of claim 1, wherein the sensing unit senses the voltage of the Q node of the dummy stage at each of a timing at which a (n−1)th gate pulse of first to (n)th gate pulses output from the dummy stage is output and a timing at which the (n)th gate pulse is output.

10. The light emitting display apparatus of claim 1, wherein the controller supplies the compensation signal, which allows the voltage of the Q node when the gate pulses are output from the dummy stage to be a maximum value of voltages of the Q node when the gate pulses are output, to the stages.

11. A light emitting display apparatus comprising:
a gate driver including a plurality of stages connected with a plurality of gate lines provided in a display area and a dummy stage connected with a plurality of dummy gate lines provided in a non-display area;
a sensing unit connected with the dummy stage connected with at least two dummy gate lines provided in the non-display area; and
a controller connected with the sensing unit,
wherein each of the plurality of stages sequentially outputs at least two gate pulses to at least two gate lines, and each of the at least two gate lines is connected to a switching transistor provided in the display area,
wherein the dummy stage sequentially outputs at least two gate pulses to the at least two dummy gate lines,
wherein the sensing unit senses a voltage of a Q node to which a Q node signal for allowing the at least two gate pulses to be output from the dummy stage is supplied,
wherein the controller supplies a compensation signal based on the voltage of the Q node to the plurality of stages, and
wherein the sensing unit senses the voltage of the Q node of the dummy stage at a timing at which an (n)th gate pulse among first to (n)th gate pulses output from the dummy stage is output.

12. The light emitting display apparatus of claim 11, wherein a width of the (n)th gate pulse is greater than that of the first to (n−1)th gate pulses.

13. A light emitting display apparatus comprising:
a gate driver including a plurality of stages connected with a plurality of gate lines provided in a display area and a dummy stage connected with a plurality of dummy gate lines provided in a non-display area;
a sensing unit connected with the dummy stage connected with at least two dummy gate lines provided in the non-display area; and
a controller connected with the sensing unit,
wherein each of the plurality of stages sequentially outputs at least two gate pulses to at least two gate lines, and each of the at least two gate lines is connected to a switching transistor provided in the display area,
wherein the dummy stage sequentially outputs at least two gate pulses to the at least two dummy gate lines,
wherein the sensing unit senses a voltage of a Q node to which a Q node signal for allowing the at least two gate pulses to be output from the dummy stage is supplied,
wherein the controller supplies a compensation signal based on the voltage of the Q node to the plurality of stages, and
wherein the controller extracts voltages of the Q node at periods at which second to (n)th gate pulses of first to (n)th gate pulses output from the dummy stage are output, by using at least one signal sensed from the Q node of the dummy stage, and supplies the compensation signal, which allows the extracted voltages to be maximum values of the voltages of the Q node when the gate pulses are output, to the stages.

14. The light emitting display apparatus of claim 13, wherein the controller supplies the compensation signal to the stages at periods at which the second to (n)th gate pulses of the first to (n)th gate pulses output from each of the stages are output.

* * * * *